United States Patent [19]

Marrah et al.

[11] Patent Number: 4,882,548
[45] Date of Patent: Nov. 21, 1989

[54] LOW DISTORTION CURRENT MIRROR

[75] Inventors: Jeffrey J. Marrah; Gregory J. Manlove, both of Kokomo; Richard A. Kennedy, Russiaville, all of Ind.

[73] Assignee: Delco Electronics Corporation, Kokomo, Ind.

[21] Appl. No.: 288,372

[22] Filed: Dec. 22, 1988

[51] Int. Cl.$^4$ ............................................. H03F 3/16
[52] U.S. Cl. ..................................... 330/288; 330/277
[58] Field of Search ................ 323/315, 316; 330/149, 330/277, 288, 296, 291, 293

[56] References Cited

U.S. PATENT DOCUMENTS 4,525,682 6/1985 Lai et al. ............................... 330/288

Primary Examiner—Steven Mottola
Attorney, Agent, or Firm—Albert F. Duke

[57] ABSTRACT

A current mirror implemented preferably in MOS technology provides low total harmonic distortion and high output impedance and maintains the input signal within one Vgs of the supply voltage source. For an input signal having DC and AC components I and i, a constant current of 2I is fed to the input terminal. A transistor couples the input terminal to the output terminal. The difference of the constant current and the input current is the output current I-i which passes through the transistor to the output terminal. An amplifier having its input connected to the input terminal and its output fed back to the gate or base of the transistor helps maintain the input terminal at a constant voltage.

7 Claims, 2 Drawing Sheets

LOW DISTORTION CURRENT MIRROR

FIELD OF THE INVENTION

This invention relates to a low total harmonic distortion current mirror and particularly to such a current mirror having high output impedance and which allows the input voltage to closely approach the supply voltage

BACKGROUND OF THE INVENTION

It is proposed here to provide a current mirror for ah application with specific requirements. The application requires less than 0.1 percent total harmonic distortion (THD) without the use of conventional feedback techniques, and also requires that the input signal can be within 1 Vgs of the supply voltage. Most MOS current mirrors with low THD requirements are used in conjunction with high gain stages and use standard feedback techniques. The effective distortion of a circuit used in this manner is the distortion of the output current mirror divided by the overall gain of the circuit. Therefore, a 0.1 percent specification THD can normally be achieved with an output current mirror exhibiting 10 percent distortion and an overall circuit gain of 100, using standard feedback design. A new circuit had to be developed to meet the distortion requirements and allow the input voltage to get within a Vgs of supply. Standard feedback techniques could not be used.

There are a number of standard current mirrors that have been used for a variety of applications. These have been found to be unacceptable for a number of reasons. A description of some of these circuits will be presented to show why a new circuit had to be developed, and to help clarify why this specific technique is different from the others. Each of these circuits is shown using P-channel MOS transistors.

One known circuit is a basic current mirror shown in FIG. 1. The circuit is made up of two matched transistors, P1 and P2, where one transistor, P1, has the gate connected to the drain and sets the gate voltage of P2. The first order model of a MOS device in saturation has no dependance on the drain voltage; however, all devices have some finite output impedance. This output impedance causes a modulation in the drain current of P2 as a function of its drain voltage. This finite output impedance limits the THD of the circuit to approximately 1.5 percent with signal swings of 1 Vrms.

A second prior circuit is a Wilson current mirror shown in FIG. 2. The circuit is made up of three matched transistors P3-P5. Transistor P3 is connected between the voltage supply and the signal input terminal so that the signal current is pulled through P3. In a separate path the transistors P4 and P5 are connected in series between the voltage supply and the output terminal so that the output signal current is the current through transistors P4 and P5. The drain of P4 is coupled to the gates of P3 and P4 and the gate of P5 is coupled to the drain of P3. The gate voltage on P3 is set by the feedback from the drain of P3 across the Vgs of P5. The gate voltage of P3 is also the gate to drain voltage of P4, thus the currents of P3 and P4 are matched. The output current is taken from the drain of P5 which has the same current as in P3 and P4. Large variations in the drain voltage of P5 have very small effects on the current set by P3 and P4; therefore, the output impedance of this stage is far greater than the basic P-channel mirror of FIG. 1. The amount of output impedance improvement of this circuit over the previous one described is equal to the inverse of the transconductance of P3 times the output impedance of P3. This can be an improvement of approximately 50 times with reasonable device sizes. The distortion of this circuit is approximately the THD of the basic current mirror of FIG. 1 divided by 50 (due to the improvement in output impedance). The Wilson mirror exhibits the required output impedance to achieve the 0.1 percent THD, but the input voltage can only get to within 2 Vgs of supply. This is unacceptable for this application.

The third prior art circuit is a folded cascode current mirror shown in FIG. 3. The circuit is made up of three matched transistors P7-P9, and one 2X transistor P6. That is, P7-P9 have the same transistor geometry and particularly the same width to length ratio W/L, while P6 has a ratio 2W/L so that for the same applied voltages twice the current will flow. A reference current is established through P7 and P9 and set equal to the DC component of the input current. Twice this DC current is present in P6. The signal current is applied to the source of P8 and the drain of P6. The AC current in the signal modulates the current across P8 (it is assumed that the maximum AC current is no greater than the DC current). The output of this stage is the drain of P8. It has an output impedance similar to the Wilson current mirror with approximately 50X improvement over the basic current source. This circuit exhibits the desired output impedance and the input voltage can get to within a Vgs-Vt of supply. The problem with this circuit is the input impedance of the circuit is approximately equal to the inverse of the transconductance of P8. The variation in the source voltage of P8 modulates the drain voltage of P6. This creates error current as a function of the signal current, which is a source o distortion. This circuit, due to the high input impedance, has only an improvement in THD of 10 over the basic current mirror. This is not enough to satisfy the required specification.

SUMMARY OF THE INVENTION

It is therefore an object of the invention to provide a current mirror having total harmonic distortion of 0.1% or less, no conventional feedback, a high output impedance, and the ability of the input signal to reach within 1 Vgs of the supply voltage.

The invention is carried out by a current mirror for an input signal having a DC component modulated by an AC component comprising a current source for providing to an input terminal a constant current greater than the DC component of the input signal, a first current path from the input terminal comprising an input terminal for coupling to the input signal, a second current path from the input terminal comprising an output terminal and a first transistor coupling the input terminal to the output terminal, whereby the output signal is the difference of the constant current and the input current, and an amplifier consisting of a second transistor having a control terminal connected to the input terminal and an output connected to the control element of the first transistor for providing a high gain feedback to maintain a constant input terminal voltage, thereby affording low input impedance and low harmonic distortion in the output signal.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE PREFERRED EMBODIMENT

The specific current mirror described below is specifically designed for MOS technology using P-channel transistors. The invention also applies, however, to the equivalent circuit using N-channel devices or bipolar transistors. Direct substitution of bipolar devices is possible since each type of transistor has a control terminal (gate or base) and primary terminals (emitter and collector or source and drain). In this current mirror, the input current and the output current both have a DC component and an AC component. The AC components must be the same in the input and output, within the specified THD, and in the preferred embodiment the DC components will also be equal.

Figure 4:
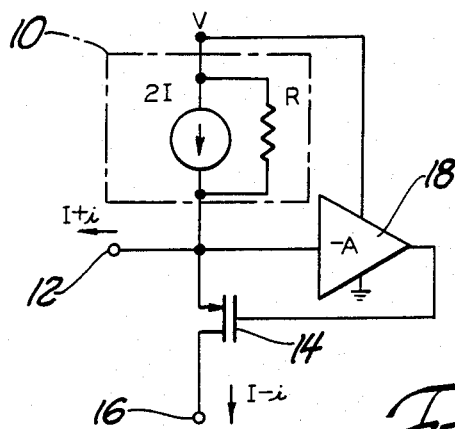
FIG. 4 is a schematic diagram of the current mirror according to the invention.

As shown in FIG. 4, a P-channel MOS current mirror comprises a non-ideal current source 10 with a finite output impedance R coupled to the voltage supply V which provides current to an input terminal 12. A transistor 14 is connected between the input terminal 12 and an output terminal 16 providing the required high output impedance. An internal feedback is provided by an amplifier 18 connected to the voltage supply and having its input coupled to the input terminal 12 and its output coupled to the gate of the transistor 14. By coupling the input terminal through the amplifier to the voltage supply the input terminal can be maintained one Vgs from the supply voltage. The amplifier voltage is fed back through the transistor to the input terminal 12, thereby keeping the input at a substantially constant voltage. In the preferred form, the current from the current source 10 is two times the DC component of the input signal so that the input and output signals will evenly divide the source current except for the AC modulation. As an instantaneous AC signal is added to the DC component of the input, an equal signal will be subtracted from the output so that the AC components will be the same, except for a phase inversion. Thus for an input signal having a DC component I and an AC component i, the current source 10 provides a current 2I and the output signal will be I-i. Alternatively, the source 10 may provide any current greater than I and the AC component will be faithfully reflected in the output signal so long as it is not greater than the difference between the source 10 current and the DC component.

Figure 1:
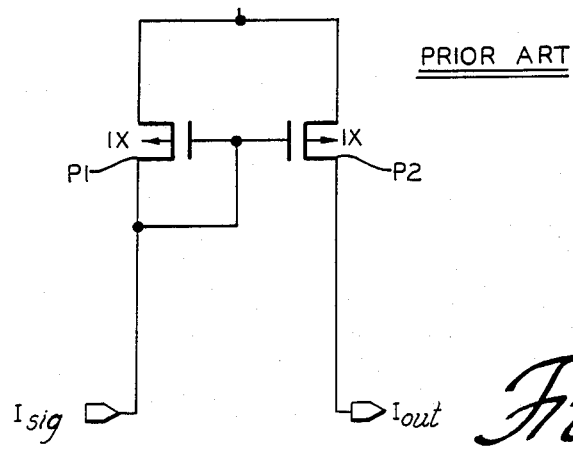
FIGS. 1, 2 and 3 are schematic diagrams of prior art current mirrors.
Figure 2:
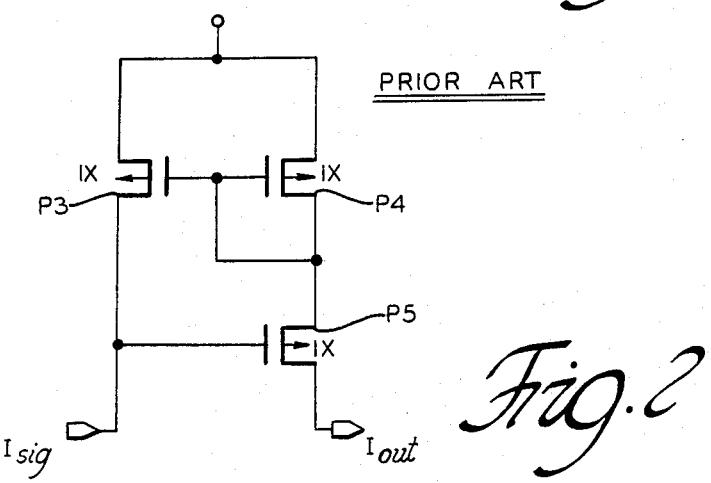
Figure 3:
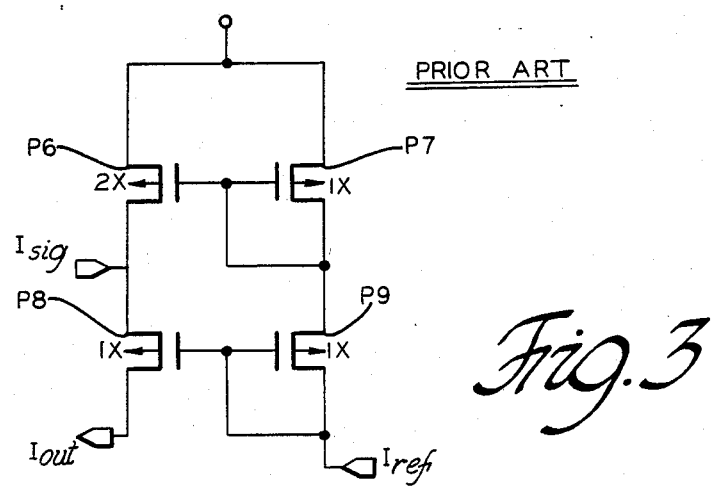

This circuit arrangement using a single transistor amplifier 18 has an output impedance similar to the Wilson current mirror with approximately 50 times improvement over the basic current source (FIG. 1). This circuit exhibits the desired output impedance and the input voltage can get within a Vgs of supply voltage V. The input impedance to this circuit is reduced by local feedback from the amplifier 18 to the gate of transistor 14. The local feedback has a gain of approximately 50, and reduces the input impedance of the circuit by that amount so that the variation in the source current of transistor 14 has 50 times less effect on the input terminal voltage (compared to the folded cascode circuit of FIG. 3). Thus the error current on the non-ideal current source 10 is very small with respect to the signal current and the THD of 0.1 percent can now be achieved. The input voltage can get to within 1 Vgs of supply. This circuit meets all the desired requirements.

Figure 5:
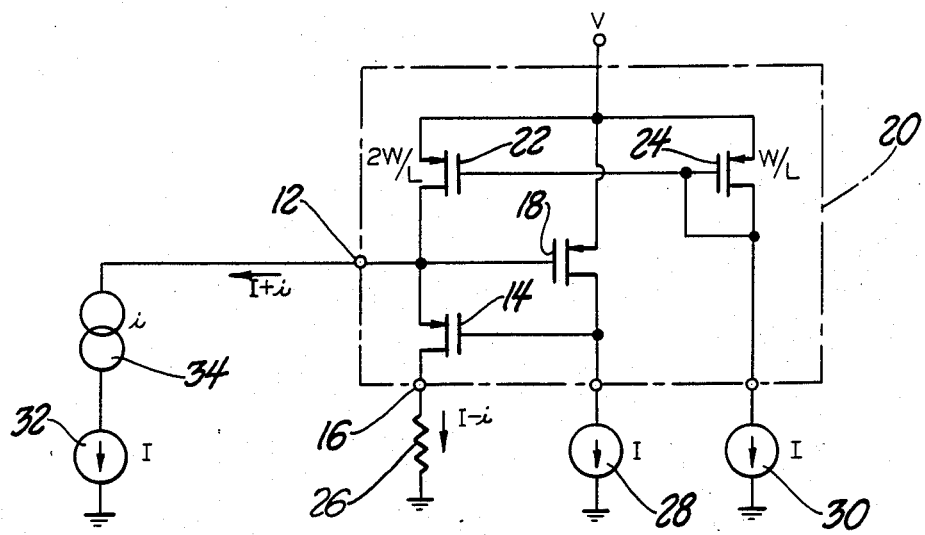
FIG. 5 is a schematic diagram of a specific implementation of the current mirror of FIG. 4.

FIG. 5 shows the P-channel current mirror 20 in detail. The current source is implemented as a simple current mirror and comprises a first transistor 22 and a second transistor 24 with both gates connected to the drain of transistor 24 and both sources connected to the voltage supply V. The transistor 24 has a transistor constant W/L and the transistor 22 has a transistor constant 2W/L so that in this circuit the transistor 22 will have a current two times that of the transistor 24. The transistor 14 as well as the amplifier transistor 18 may also have a transistor constant of W/L. The source of the amplifier transistor 18 is connected to the voltage supply V and its drain is coupled to the gate of the transistor 14. The gate of the amplifier transistor 18 is connected to the input terminal 12 so that the terminal is one Vgs from the voltage supply V. Each of the transistors 18 and 24 has its drain connected to a current source 28 and 30, respectively, each providing a current of I equal to the DC component of the input signal. The input signal is shown as being developed from a similar current source 32 providing a current I and an AC source 34 having a current i. Since the current sources 28, 30 and 32 all have the same current I it is easy to produce precisely the same current in each. The current source 28 need not have a current I, rather another value may be chosen. The source 30 also need not have a value I but optimal dynamic range is obtained at that value. The output terminal 16 is connected through a resistor 26 to ground so that a voltage proportional to the output current appears at the output terminal 16.

In operation, the current I pulled through the transistor 24 is reflected in transistor 22 as a current of 2I which is supplied to the input terminal 12. The input signal I+i is a current flowing from the terminal 12 so that the current remainder, I−i, is passed through the transistor 14 and is the output current. Any tendency for the input terminal voltage to vary with current would effect the current through the transistor 22, however the internal feedback through the amplifier 18 resists any such voltage variation: a lower voltage at the input terminal 12 results in a higher voltage at the drain of the transistor 18 which higher voltage is reflected at the source of transistor 14 due to the feedback to the gate of transistor 14.

The embodiments of the invention in which an exclusive property or privilege is claimed are defined as follows:

1. A current mirror producing a low total harmonic distortion output signal, said current mirror comprising;
    a first current path including an input terminal for carrying an input signal comprising a DC component modulated by an AC component,
    a second current path comprising an output terminal and a transistor coupling the input terminal to the output terminal, said transistor including a control element,
    a current source for coupling to the input terminal a constant current two times the DC component of the input signal, whereby the output signal is the difference of the input signal and the constant current, and
    an amplifier having an input from the input terminal and its output connected to the control element of the transistor for providing a high gain feedback to maintain a constant voltage at the input terminal, thereby affording low harmonic distortion in the output signal.

2. A current mirror producing a low total harmonic distortion output signal, said current mirror comprising;
   a first current path including an input terminal for carrying an input signal comprising a DC component modulated by an AC component,
   a current source for coupling to the input terminal a constant current two times the DC component of the input signal,
   a second current path comprising an output terminal and a transistor coupling the input terminal to the output terminal, whereby the output signal is the combined values of the constant current and the input current, said transistor including a control element, and
   an amplifier having an input from the input terminal and its output connected to the control element of the transistor for providing a high gain feedback to maintain a constant voltage at the input terminal, thereby affording low harmonic distortion in the output signal.

3. A current mirror producing an output signal from an input signal having a DC component modulated by an AC component comprising
   a current source for providing to an input terminal a constant current greater than the DC component of the input signal,
   a first current path from the input terminal comprising an input terminal for coupling to the input signal,
   a second current path from the input terminal comprising an output terminal and a first transistor coupling the input terminal to the output terminal, said transistor including a control element, whereby the output signal is the difference of the constant current and the input current, and
   an amplifier consisting of a second transistor having a control terminal connected to the input terminal and an output connected to the control element of the first transistor for providing a high gain feedback to maintain a constant input terminal voltage, thereby affording low input impedance and low harmonic distortion in the output signal.

4. The invention as defined in claim 3 wherein the second transistor has a primary terminal coupled to a fixed voltage supply terminal so that the input terminal voltage is separated from the said fixed voltage by the voltage drop between the control terminal and the primary terminal of the transistor.

5. The invention as defined in claim 3 wherein the current source provides a constant current twice the value of the said DC component, whereby the output signal has a DC component equal to the input signal and an AC component equal in absolute value to that of the input signal.

6. The invention as defined in claim 3 wherein the current source is a MOS current mirror having a third transistor having a transistor constant W/L and carrying a constant current equal to the DC component of the input signal, and a fourth transistor having a transistor constant 2W/L, the sources of both the third and fourth transistors being connected to a voltage supply and the gates of both transistors being connected to the drain of the third transistor so that the fourth transistor carries twice the current of the third transistor and the drain of the fourth transistor is connected to the input terminal.

7. A CMOS current mirror for operation with an input signal within one Vgs of voltage supply comprising;
   an input terminal for an input signal having a DC component and an AC component,
   a first transistor having a channel constant of 2W/L and second, third and fourth transistors having channel constants and W/L,
   the first transistor having its source connected to the voltage supply and its drain connected to a first node comprising the input terminal,
   the second transistor connected between the voltage supply and a current source and having its drain coupled to its gate and to the gate of the first transistor, the current source having a current equal to the said DC component of the input signal whereby a constant current flow of two times the DC component is established in the first transistor,
   the third transistor connected between the first node and an output terminal,
   the fourth transistor connected between the voltage supply and a reference current supply and having its gate connected to the first node and its drain connected to the gate of the third transistor to provide feedback for maintaining the node voltage substantially constant.

* * * * *